(12) United States Patent
Sachs (10) Patent No.: US 10,439,556 B2
(45) Date of Patent: Oct. 8, 2019

(54) HYBRID RC/CRYSTAL OSCILLATOR (71) Applicant: Microchip Technology Incorporated, Chandler, AZ (US)

(72) Inventor: Jason Sachs, Chandler, AZ (US)

(73) Assignee: MICROCHIP TECHNOLOGY INCORPORATED, Chandler, AZ (US)

(*) Notice: Subject to any disclaimer, the term of this patent is extended or adjusted under 35 U.S.C. 154(b) by 148 days.

(21) Appl. No.: 15/491,803

(22) Filed: Apr. 19, 2017

(65) Prior Publication Data

US 2017/0310278 A1     Oct. 26, 2017

Related U.S. Application Data

(60) Provisional application No. 62/325,042, filed on Apr. 20, 2016.

(51) Int. Cl.
*H03B 5/32* (2006.01)
*H03B 5/20* (2006.01)
*H03L 7/14* (2006.01)

(52) U.S. Cl.
CPC ............. *H03B 5/32* (2013.01); *H03B 5/20* (2013.01); *H03L 7/14* (2013.01); *H03B 2201/02* (2013.01)

(58) Field of Classification Search
CPC .................................. H03B 5/32; H03B 5/20
See application file for complete search history.

(56) References Cited

U.S. PATENT DOCUMENTS

| 3,555,446 A | 1/1971 | Braymer .................. 331/16 |
| 2007/0069829 A1 | 3/2007 | Gehring .................. 331/158 |
| 2015/0188543 A1* | 7/2015 | Jain ................ H03K 19/017509 |
| | | 327/156 |
| 2016/0308491 A1* | 10/2016 | Elgaard .................... H03B 5/06 |

FOREIGN PATENT DOCUMENTS

| EP | 0355466 A2 | 2/1990 | ........... G01R 29/027 |
| EP | 2884658 A1 | 6/2015 | ............... H03B 5/06 |

OTHER PUBLICATIONS

International Search Report and Written Opinion, Application No. PCT/US2017/028595, 11 pages, dated Jul. 7, 2017.
Matthews, Dan, "AN849: Basic PICmicro® Oscillator Design," Microchip Technology Incorporated, 24 pages, 2002.
Rychen, J. et al., "A Low-Temperature Dynamic Mode Scanning Force Microscope Operating in High Magnetic Fields," ARXIV. ORG, Cornell University Library, 6 pages, Jan. 5, 1999.
European Office Action, Application No. 17720960.8, 5 pages, dated Aug. 12, 2019.

* cited by examiner

*Primary Examiner* — Jeffrey M Shin
(74) *Attorney, Agent, or Firm* — Slayden Grubert Beard PLLC (57) ABSTRACT

An oscillator includes a tunable oscillator, a phase detector circuit communicatively coupled with an output of the tunable oscillator and an input to the oscillator, and an oscillator controller circuit configured to adjust frequency of the tunable oscillator based upon phase detection between output of the tunable oscillator and output of an external resonant element received at the input to the oscillator.

17 Claims, 5 Drawing Sheets

HYBRID RC/CRYSTAL OSCILLATOR

PRIORITY

This application claims priority to U.S. Provisional Application 62/325,042, filed Apr. 20, 2016, which is hereby incorporated in its entirety.

TECHNICAL FIELD

The present disclosure relates to integrated circuit devices, in particular, processors and microcontrollers with integrated oscillators.

BACKGROUND

Microprocessors and in particular microcontrollers require oscillators which are often integrated within the device. A frequency of the oscillator is generally determined by either an internal or an external component. Internal or external components are usually resistor capacitor (RC) elements wherein crystals are generally provided only as external components. These external components are coupled with the integrated circuit device through external pins. Start-up of an oscillator is often critical and requires defined signals and conditions. See also "Mid-range MCU reference Manual", DS31002A, 1997 available from the Assignee of the present application, Microchip Technology Inc., which is hereby incorporated by reference in its entirety.

SUMMARY

Embodiments of the present disclosure include an oscillator or an oscillator circuit. The oscillator may include a tunable oscillator communicatively coupled with a first pin. The oscillator may include a phase detector circuit communicatively coupled with an output of the tunable oscillator and an input to the oscillator. The oscillator may include an oscillator controller circuit configured to adjust frequency of the tunable oscillator based upon phase detection between output of the tunable oscillator and output of an external resonant element, such as a crystal, received at the input to the oscillator. In combination with any of the above embodiments, the oscillator may further include a second pin communicatively coupled to input to the oscillator, wherein the tunable oscillator is configured to issue output through the first pin, and the phase detector circuit is configured to receive input to the oscillator through the second pin. In combination with any suitable ones of the above embodiments, the tunable oscillator is configured to issue output through the first pin, and the phase detector circuit is configured to receive input to the oscillator through the same first pin. In combination with any suitable ones of the above embodiments, the tunable oscillator is configured to issue output through a driver circuit at the first pin, the phase detector circuit is configured to receive input to the oscillator through the first pin, and the driver circuit is configured to issue the output at the first pin as a current source and to detect voltage on the first pin as the input to the oscillator. In combination with any suitable ones of the above embodiments, oscillator controller circuit is further configured to output a crystal oscillator status based upon input to the oscillator. In combination with any suitable ones of the above embodiments, the oscillator controller circuit is further configured to maintain output of the tunable oscillator based upon a determination that an external resonant element has failed to generate a usable input to the oscillator. In combination with any suitable ones of the above embodiments, the oscillator controller circuit is further configured to adjust output of the tunable oscillator based upon a determination that a phase lock has been achieved between output of the tunable oscillator and the input to the oscillator. In combination with any suitable ones of the above embodiments, the oscillator controller circuit is further configured to maintain output of the tunable oscillator based upon a determination that a phase lock between output of the tunable oscillator and the input to the oscillator has been lost. In combination with any suitable ones of the above embodiments, the oscillator further includes a frequency multiplier circuit coupled between the tunable oscillator and the first pin, wherein an output of the frequency multiplier is coupled with the phase detector circuit to provide the output of the tunable oscillator. In combination with any of the above embodiments, the first pin may be an external pin, as an external interface for a package with the rest of the oscillator. In combination with any of the above embodiments, the second pin may be an external pin, as an external interface for a package with the rest of the oscillator. In combination with any of the above embodiments, the oscillator may include a second external pin coupled with an input of a receiver, wherein the first and second external pins are coupled with a first and second terminal of an external crystal, respectively. In combination with any of the above embodiments, an input of the receiver may be coupled with the first external pin, wherein the first external pin is coupled with a first terminal of an external crystal, wherein a second terminal of the external crystal is coupled with ground. In combination with any of the above embodiments, the tunable oscillator may be an RC oscillator. In combination with any of the above embodiments, the oscillator controller may be a slow PI controller. In combination with any of the above embodiments, the phase detector circuit may be formed by an XOR gate. In combination with any of the above embodiments, a status may include searching, locked, or lost. In combination with any of the above embodiments, the phase detector circuit may include a PLL circuit. In combination with any of the above embodiments, an accumulator may be included to add a first constant to a sum when the output of the XOR gate is one. In combination with any of the above embodiments, the accumulator may be configured to subtract a second constant from the sum when the output of the XOR gate is 0. In combination with any of the above embodiments, the constants may be equal. In combination with any of the above embodiments, equilibrium is may be reached at 90-degree phase difference when the constants are equal. In combination with any of the above embodiments, the constants may be different and steady-state equilibrium values are at or below 90 degrees. In combination with any of the above embodiments, the tunable oscillator may be a primary resonant source for the oscillator and the external resonant element may be configured to act as a sensor for the oscillator. In combination with any of the above embodiments, the tunable oscillator may be communicatively coupled with the first pin through a driver. In combination with any of the above embodiments, the phase detector circuit may be coupled to the input to the oscillator through a receiver circuit. In combination with any of the above embodiments, the second pin may be coupled to the receiver.

Embodiments of the present disclosure may include a microcontroller, including a processor, one or more peripheral circuits, and an oscillator implemented by any of the above embodiments. The oscillator may be configured to provide an oscillation signal to one or more of the peripheral circuits.

Embodiments of the present disclosure may include a system including a semiconductor device, comprising a first external pin and an internal oscillator, wherein the internal oscillator is implemented by any of the above embodiments. The system may also include an external resonant element coupled to the semiconductor device at least through the first external pin.

Embodiments of the present disclosure may include systems, packages, semiconductor devices, microcontrollers, systems, dies, chips, or other devices that include any of the oscillators of the above embodiments.

Embodiments of the present disclosure may include methods performed by any of the oscillators, systems, packages, semiconductor devices, microcontrollers, systems, dies, chips, or other devices that include any of the oscillators of the above embodiments.

DETAILED DESCRIPTION

Figure 1:
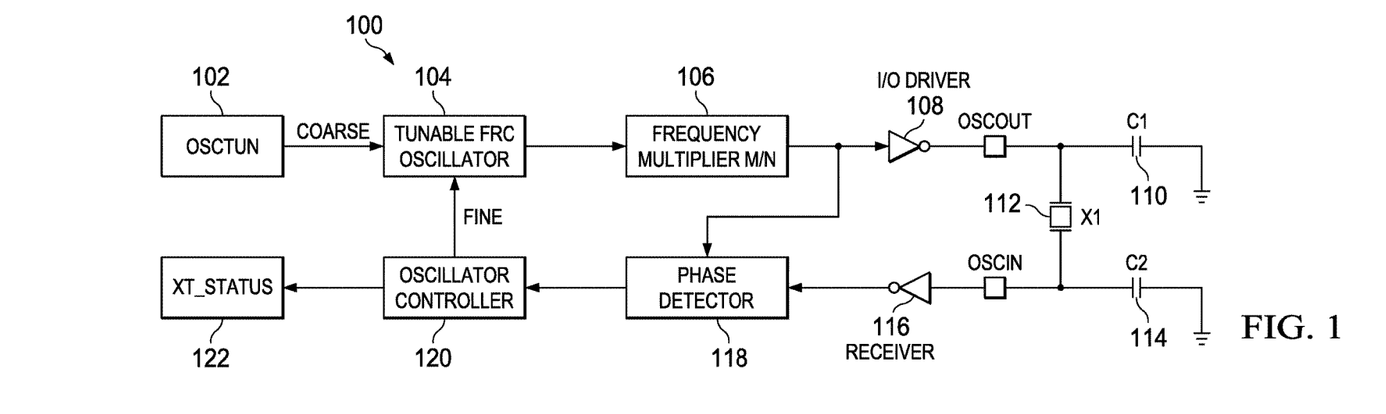
FIG. 1 is an illustration of an example embodiment of a hybrid RC/crystal oscillator, in accordance with embodiments of the present disclosure.

FIG. 1 is an illustration of an example embodiment of a hybrid RC/crystal oscillator 100, in accordance with embodiments of the present disclosure. Oscillator 100 may be implemented within an electronic device, such as a microcontroller, semiconductor chip, processor, or peripheral. For example, oscillator 100 may be implemented within a PIC microcontroller, manufactured by the Assignee of the present application.

Some microcontrollers may have options for both an internal RC-based oscillator and an external crystal or oscillator. External oscillators may add cost, take longer to start-up, use up device pins, and may hurt reliability as an external, separate component. However, external oscillators may be more accurate, which may be needed in some applications requiring precise clocks. Oscillator 100 may augment advantages of an internal RC by implementing a hybrid clock source. In one embodiment, such a source may include a tunable internal RC and an external crystal as a supplementary clock source. In another embodiment, the external crystal might be needed only as a reference sensor rather than as a primary resonant element. The oscillator may retain the reliability and quick-startup of the internal RC oscillator. This may have other advantages, such as frequency flexibility, higher signal integrity, and possible use of a single pin, rather than two pins, to connect to the external crystal, according to various embodiments.

Oscillator 100 may include an OSCOUT output and an OSCIN input to an external crystal 112, denoted as X1. The OSCOUT and OSCIN may be connected across two terminals of crystal 112. Each terminal of crystal 112 may be connected to a respective capacitor 110, 112, denoted as C1 and C2. These capacitors may in turn be connected to ground. Crystal 112 may include a quartz crystal, piezoelectric crystal, piezoelectric crystal resonator, or any other resonant element.

The values of C1 and C2 may be selected so as to match the impedance of the driving pins and crystal 112. Selection of the values may be made according to the publication "Basic PICmicro Oscillator Design", Application Note AN849, published by the assignee of the present Application. The crystal may appear to the remainder of the circuit to be inductive.

In one embodiment, the elements to the right of OSCOUT and OSCIN may be considered external components, and the elements to the left of OSCOUT and OSCIN may be considered internal components. The external versus internal nature may be made with respect to, for example, packaging of an integrated circuit device. Such an integrated circuit device might include a microcontroller, processor, peripheral, chip, package, or other suitable device. OSCOUT and OSCIN may be pins for such a package.

Oscillator 100 may include an OSCTUN input 102. OSCTUN may stand for "oscillator tuning." OSCTUN 102 may be implemented as an input to oscillator 100 so that oscillator 100 may receive working parameters from the system in which oscillator 100 is implemented. For example, OSCTUN 102 may be implemented as a register. If oscillator 100 includes a fast RC (FRC) oscillator circuit, then the register may be available so that adjustment to parameters of operation of the fast RC circuit can be made. Oscillator 100 might be calibrated in a factory or during production of oscillator 100. Thus, OSCTUN 102 might be set by a production machine making or configuring oscillator 100. However, OSCTUN 102 can be adjusted during, for example, execution of oscillator 100.

Oscillator 100 may include a tunable FRC oscillator 104. Tunable FRC oscillator 104 may receive its operational parameters from OSCTUN 102. OSCTUN 102 may provide a coarse adjustment to tunable FRC oscillator 104. In one embodiment, crystal 112 may provide users the ability to replace input from OSCTUN 102. Tunable FRC oscillator 104 frequency may be adjusted using input from OSCTUN 102 or by crystal 112. The frequency of tunable FRC oscillator 104 may be adjusted with a range, for example, of plus or minus 12%. OSCTUN 102 might be implemented in, for example, five bits. Tunable FRC oscillator 104 may be implemented by any suitable combination of analog circuitry, digital circuitry, or a combination thereof.

In one embodiment, crystal 112 may operate as a reference sensor for oscillator 100, rather than a primary resonant element. Accordingly, oscillator 100 may retain the reliability and fast start-up time associated with use of tunable FRC oscillator 104 as the primary resonant element. Crystal 112 may supplement operation of tunable FRC oscillator 104 to make adjustments. For example, the accuracy of frequency of internal RC oscillators is insufficient over the full temperature operational range of oscillator 100. A crystal grade oscillator, such as one implementation of crystal 112, is typically sufficiently accurate over such operational ranges with respect to temperature.

Tunable FRC oscillator 104 may act as the critical or baseline clock element of oscillator 100. Tunable FRC oscillator 104 may be able to generate a clock signal that, while not as accurate as crystal 112 under ideal operational circumstances, becomes valid more quickly than that of crystal 112 during start-up. Accordingly, the output of oscillator 100 may depend upon tunable FRC oscillator 104 at start-up. However, after crystal 112 is started up (with input from tunable FRC oscillator 104) and its output is locked and manipulated (through PLL, etc.), its signal may be used to fine-tune or adjust the operation of tunable FRC oscillator 104. Similarly, during any failures or inconsistencies of crystal 112, tunable FRC oscillator 104 may continue to provide a baseline output that, while not ideal, is sufficient while crystal 112 is temporarily unavailable to adjust and fine-tune the output of tunable FRC oscillator 104. When any interference, start-up, loss of lock, or other error of crystal 112 is encountered, the signal generated internally by tunable FRC oscillator 104 may be used without adjustment from crystal 112. Thus, the signal generated by crystal 112 might not itself be used as the output of oscillator 100. Instead, the signal generated by crystal 112, when available and reliable, may be used as a sensor to adjust the signal generated by tunable FR oscillator 104.

The frequency of crystal 112 may be selected so as to match the desired frequency of tunable FRC oscillator 104. Crystal 112 may be driven with the signal from tunable FRC oscillator 104 so as to generate output from crystal 112, against which the output of tunable FRC oscillator 104 is compared. The phases of the two signals may be compared and the frequency of tunable FRC oscillator 104 may be adjusted to match that of crystal 112, producing a stable equilibrium known as phase lock. During this equilibrium, typically, the signals should be within 45-60 degrees of phase. Typically, the signals should be within 45-60 degrees of phase. If crystal 112 is overdriven, it might drive at a harmonic of its base frequency, also known as an overtone. But driven properly, its frequency matches the FRC desired value relative to phase difference, shown in FIG. 6 and discussed below, may drive phase detection. The amplitude might need only be sufficient to get a valid signal as input. Phase comparison, performed by a phase detector, may require sufficient amplitude from both signals and produces a signal that is a monotonic function of relative phase difference between two signals.

Furthermore, oscillator 100 may include a frequency multiplier 106. Frequency multiplier 106 may be implemented by any suitable combination of analog circuitry, digital circuitry, or a combination thereof. Frequency multiplier 106 may be implemented as an M/N type frequency multiplier. In such an implementation, frequency multiplier 106 may include a phase-locked loop (PLL) multiplier "M" followed by a clock divider "N" such that an I/O driver 108 may issue a signal with a submultiple of the PLL multiplier. The signal may be a submultiple of the system clock frequency if M=1. The output frequency may be given by $f1=M/N*f0$, wherein f1 is the frequency of the signal applied to the I/O pin and f0 is the input frequency, the frequency of the FRC module.

Oscillator 100 may include an I/O driver 108, implemented by any suitable combination of analog circuitry, digital circuitry, or a combination thereof. I/O driver 108 may be implemented by a series of one or more buffered or unbuffered inverters. I/O driver 108 may generate, from the signal generated by tunable FRC oscillator 104 as adjusted by frequency multiplier 106, a square wave signal and apply it to crystal 112. I/O driver 108 may output the square wave signal through the OSCOUT pin. The square wave signal, as formatted by I/O driver 108, may cause resonant signals to be generated by crystal 112. I/O driver 108 and receiver 116 may be implemented as a voltage-limited current source or sink, driven with positive and negative current for each half of the source clock square wave, rather than a voltage source, to improve power dissipation characteristics.

Figure 2:
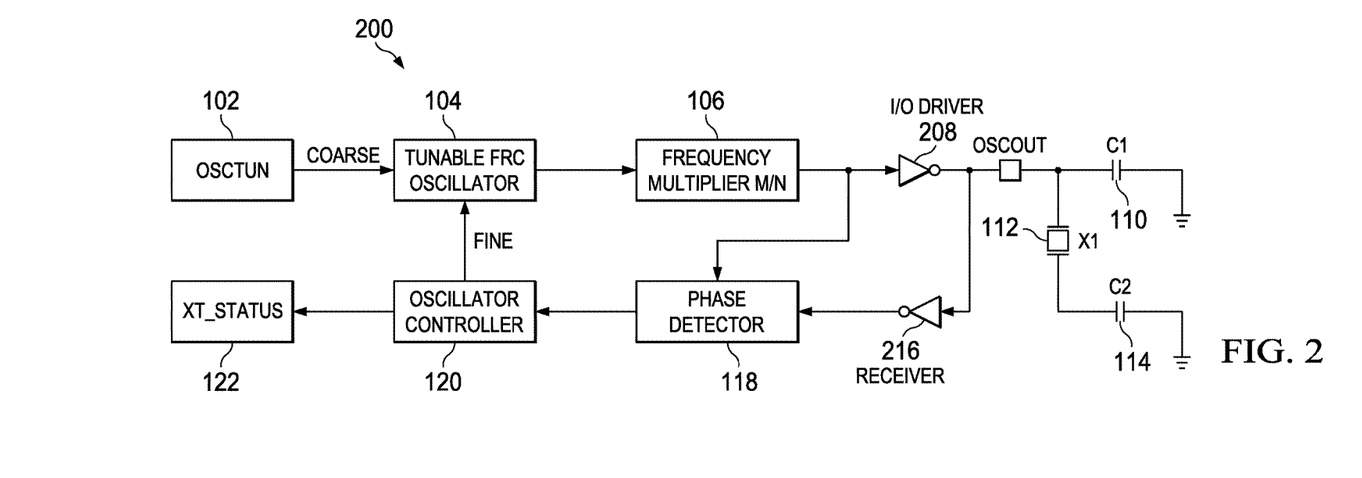
FIG. 2 is an illustration of another example embodiment of a hybrid RC/crystal oscillator, in accordance with embodiments of the present disclosure.

In one embodiment, the OSCIN pin may be attached to the other end of crystal 112. In another embodiment, as shown in FIG. 2, the OSCIN pin might be attached to crystal 112 in that the OSCOUT pin and the OSCIN pin are the same pin. The OSCIN pin may feed a signal from the other end of crystal 112 to a receiver 116.

Receiver 116 may be implemented by any suitable combination of analog circuitry, digital circuitry, or a combination thereof. Receiver 116 may be implemented by a series of one or more buffered or unbuffered inverters. Receiver 116 may be configured to convert the resulting signal into a digital waveform. Such a signal may be a square wave. Resonance of crystal 112 may produce a band-pass filter. Such a band-pass filter may reject all or nearly all harmonics of the driving waveform received by crystal 112 except at the resonant frequency. Thus, the result may be a sine wave which, after receipt and conversion by receiver 116, may be digitized into a square wave.

Oscillator 100 may include a phase detector 118. Phase detector 118 may be implemented by any suitable combination of analog circuitry, digital circuitry, or a combination thereof. Phase detector 118 may accept as input the signal that was generated by tunable FRC oscillator 104 and modified by frequency multiplier 106. Phase detector may also accept as input the signal that was generated by receiver 116. In one embodiment, these inputs may include input and output square waves. Phase detector 118 may include, for example, an XOR gate followed by an accumulator. The accumulator may perform an accumulation, such as adding a predetermined amount (K1) to a sum when the output of the XOR gate is a logical one. Furthermore, the accumulation may subtract another predetermined amount (K2) from the some when the output of the XOR gate is a logical zero. Accordingly, a steady-state equilibrium may be reached, dependent on the values K1 and K2. If K1 and K2 are equal, then equilibrium is reached at 90° phase difference. Adjusting K1 and K2 may allow other steady-state equilibrium values above or below 90°.

Oscillator 100 may include an oscillator controller 120. Oscillator controller 120 may be implemented by any suitable combination of analog circuitry, digital circuitry, or a combination thereof. Oscillator controller 120 may be configured to control PLL operation. The PLL may be analog or digital. Oscillator controller 120 may be implemented as a proportional-integral (PI) controller with independently controllable "P" and "I" gains to control the bandwidth and phase margin of the phase-locked loop. Such a phase-locked loop may be a relatively slow bandwidth (typically 10-1000 Hz) depending on design tradeoffs between response time and jitter/stability issues. Oscillator controller 120 may provide fine adjustment to tunable FRC oscillator 104. Operation of an implementation of oscillator controller 120 may be given, in a digital implementation, according to an integrator defined by $int[n]=int[n-1]+Ki*x[n]$. Output may be given by $out[n]=int[n]+Kp*x[n]$. The term $x[n]$ may specify input error at timestep n, wherein the $[n]$ notation may apply to any signal or digital value. Ki may specify an integral gain and Kp may specify a proportional gain. Such an implementation may use multipliers, which might be expensive in terms of circuitry or die space if implemented to execute in a single clock cycle. Accordingly, oscillator control 120 may be improved by reducing a bit width of constants Kp or Ki, such as using 4-6 bits instead of 16 bits. Furthermore, oscillator control 120 may be improved to reduce required area and cost by implementing multiplication operations with a serial shift-and-add circuit that takes several clock cycles to complete. The frequency of tunable FRC oscillator 104 may be adjusted so as to track the crystal resonance.

As a result, tunable FRC oscillator 104 may provide a fast startup and high-frequency stability with respect to frequency output. Crystal 112 may be used only to provide fine adjustment to tunable FRC oscillator 104. The fine adjustment provided from crystal 112 through oscillator controller 120 may be, at its full-scale gain, the equivalent range of four to eight counts of coarse adjustment from OSCTUN. The frequency range may be restricted such that oscillator 100 does not oscillate at overtones. Oscillator 200, described below, may lock according to an impedance phase rather than voltage response. The impedance response, as opposed to the voltage response, may be used by the PLL by comparing a signal representative of the output current (at the OSCIN/OSCOUT pin) to the received input voltage (at the OSCIN/OSCOUT pin).

Oscillator controller 120 may also include a state machine. The state machine may track whether receiver 116 has detected an input signal. If receiver 116 has not detected an input, oscillator controller 120 may cause a slow frequency sweep until phase lock is detected. This operation may extend the pull-in range of oscillator 100 and also provides a way to detect a crystal oscillator status, which may be issued as XT_STATUS 122. States in the state machine may be represented in XT_STATUS 122, such as searching for a frequency (and thus no input from receiver 116 or input from receiver 116 and the PLL is operating), locked frequency (and thus input from receiver 116 and subsequent locked frequency from the PLL), or lock lost (and thus dropped input from receiver 116 or other disparate input).

Oscillator controller may operate at relatively slow rate, such as less than 1 kHz. In response to fine adjustment from oscillator controller 120, tunable FRC oscillator 104 may adjust its output frequency or phase.

In one embodiment, if crystal 112 has failed to start, tunable FRC oscillator 104 may maintain a nominal frequency. In another embodiment, if crystal 112 starts initially but later fails, tunable FRC oscillator 104 may maintain a nominal frequency. Crystal 112 may fail in such a way if, for example, there is an open or short circuit, or temperature, humidity, interference, or other environmental factors cause gain to be reduced below a detectable level.

FIG. 2 illustrates another example embodiment of an oscillator, according to embodiments of the present disclosure. Oscillator 200 may be implemented similarly to oscillator 100. However, in one embodiment I/O driver 208 and receiver 216 may be implemented as a current source/sink driver. In a further embodiment, I/O driver 208 and receiver 216 might be implemented within a same circuit or element. In another, further embodiment, a single pin might be used to interface crystal 112 with the elements on left-side of the figure, such elements on the left-side of the figure starting with the pin OSCOUT implemented internally within a microcontroller, processor, package, semiconductor device, or other device. In one embodiment, voltage on the OSCOUT pin may be used as a receiver signal. In another embodiment, phase detector 118 may take advantage of the phase shift between driver current and driver voltage caused by the resonant element.

Oscillator 200 and oscillator 100 may also be implemented with respect to on-chip resonant oscillators wherein crystal 112 is implemented as silicon inductor-capacitor circuits, or co-packaged dual-die microelectromechanical system oscillators or quartz crystal devices. In these embodiments, the implementation of crystal 112 may still be external to tunable FRC oscillator 104 even though all circuit elements are internal to the overall package.

Figure 3:
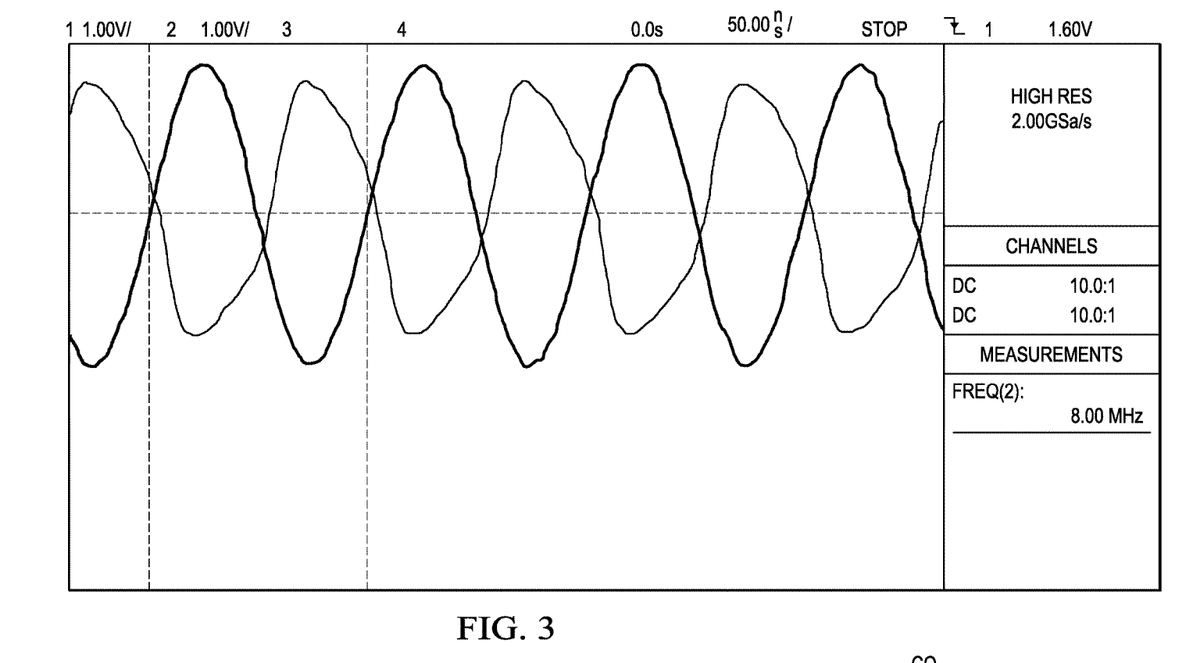
FIG. 3 illustrates waveforms measuring typical OSCIN/OSCOUT signals, according to embodiments of the present disclosure.

FIG. 3 illustrates waveforms measuring typical OSCIN/OSCOUT signals, according to embodiments of the present disclosure. The view of FIG. 3 may be from an oscilloscope. A first graph trace may show OSCIN input into crystal 112, while a second graph trace may show an OSCOUT output from crystal 112. The graph of FIG. 3 may have been created using an 8.00 MHz crystal 112 and two 33 pF loading capacitors 110, 114. Graph 1 may be OSCOUT, and graph 2 may be OSCIN. The two signals may be approximately 180° apart. When added to the 180° phase shift of oscillator driver 208, this configuration meets the Barkhausen stability condition for oscillation, wherein total phase shift must be a multiple of 360°, with a loop gain of 1.

Figure 4:
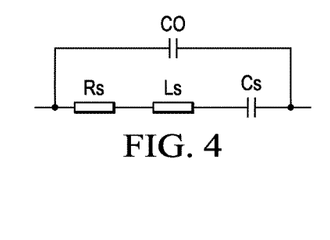
FIG. 4 illustrates an equivalent circuit model of the oscillators, in accordance with embodiments of the present disclosure.

FIG. 4 illustrates an equivalent circuit model of the oscillators, in accordance with embodiments of the present disclosure. In particular, crystal 112 may be modeled approximately by a series RLC combination with parasitic capacitance Co. For the instance of crystal 112 from FIG. 3, the values of the lumped-parameter equivalent circuit were determined as Co=4.24 pF, Cs=16.5 fF, Ls=10.6 mH, and Rs=9Ω. The frequency response of this circuit is shown below in FIG. 5 for load capacitors of 15 pF, 20 pF, and 33 pF. This models the OSCOUT source as a perfect sine wave at a given frequency, and the load circuit of the crystal equivalent circuit along with the two parallel load capacitors. The four subgraphs are, in order:

Transfer function magnitude (OSCIN/OSCOUT), in decibels

Transfer function phase shift, in degrees

OSCIN load admittance magnitude (output current divided by output voltage), A/V

OSCIN load admittance phase, in degrees

Figure 5:
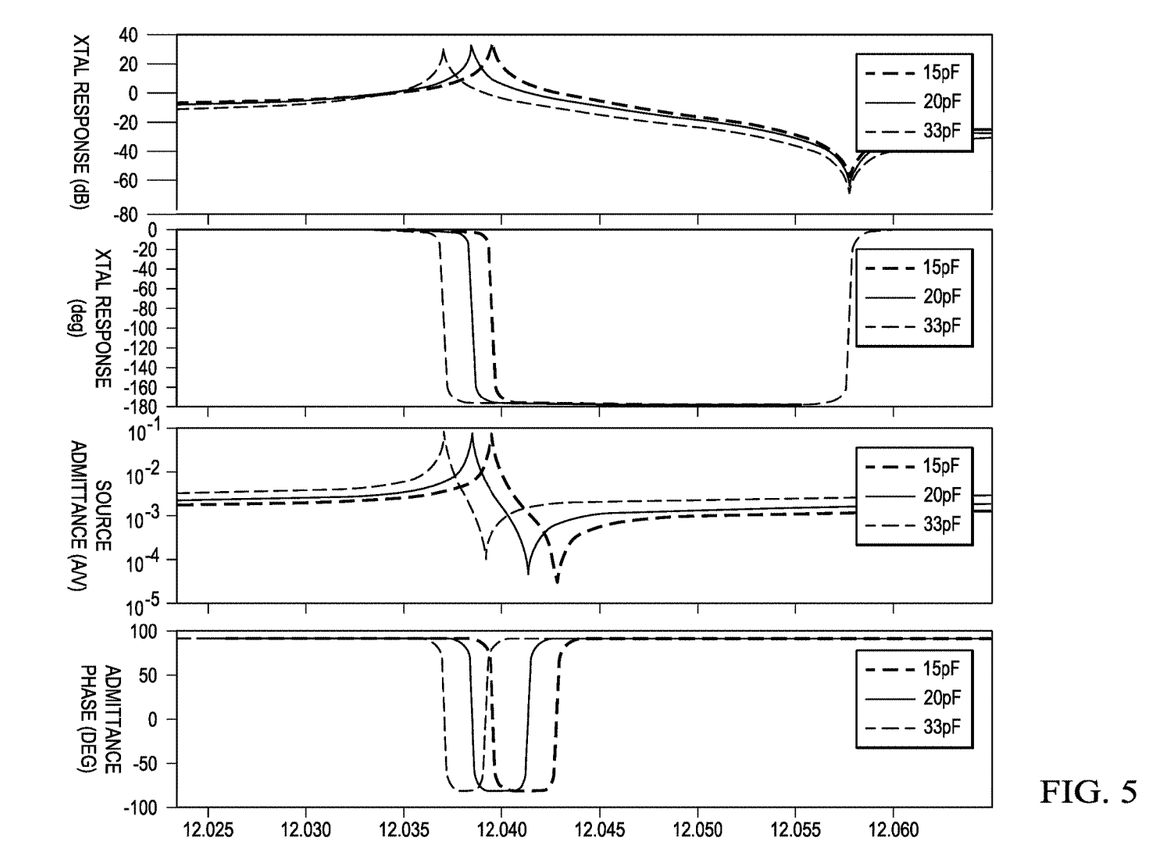
FIG. 5 illustrates operation and response of the circuit mode, in accordance with embodiments of the present disclosure.

The series resonance (peaks in the response magnitude) and parallel resonances (notches in the response magnitude) are both around 12.0 MHz. The series resonant frequency has a small sensitivity to load capacitance. The parallel resonance in the transfer function has virtually no dependence on load capacitance but represents a notch filter response with low signal level.

Typical operation of a traditional oscillator is at the point where the transfer function phase is close to ±180° and the loop gain is 1.0. This represents a frequency that is slightly greater than that of the series resonant peak.

Accordingly, the phase detector approach according to various embodiments of oscillators 100, 200 may be most effective when the circuit response has high phase sensitivity. Such high phase sensitivity may be highest at approximately 90° phase shift. However, this may also be the point at which the load seen by the source has the highest admittance and therefore may require the highest current draw for a given voltage magnitude. A 90° phase shift represents pure reactive power, and therefore it is theoretically possible to produce this oscillation with very little net power if suitable storage inductance or capacitance is available and the output driver uses energy-recovery techniques. If this causes overdriving the crystal or excessive power dissipation, several mitigation approaches can be used. First, the equilibrium phase can be adjusted to be at a different point e.g. 45° or 135°. Second, the driver gain might be dynamically adjusted to reduce signal magnitude. Third, a current source output might be used.

Figure 6:
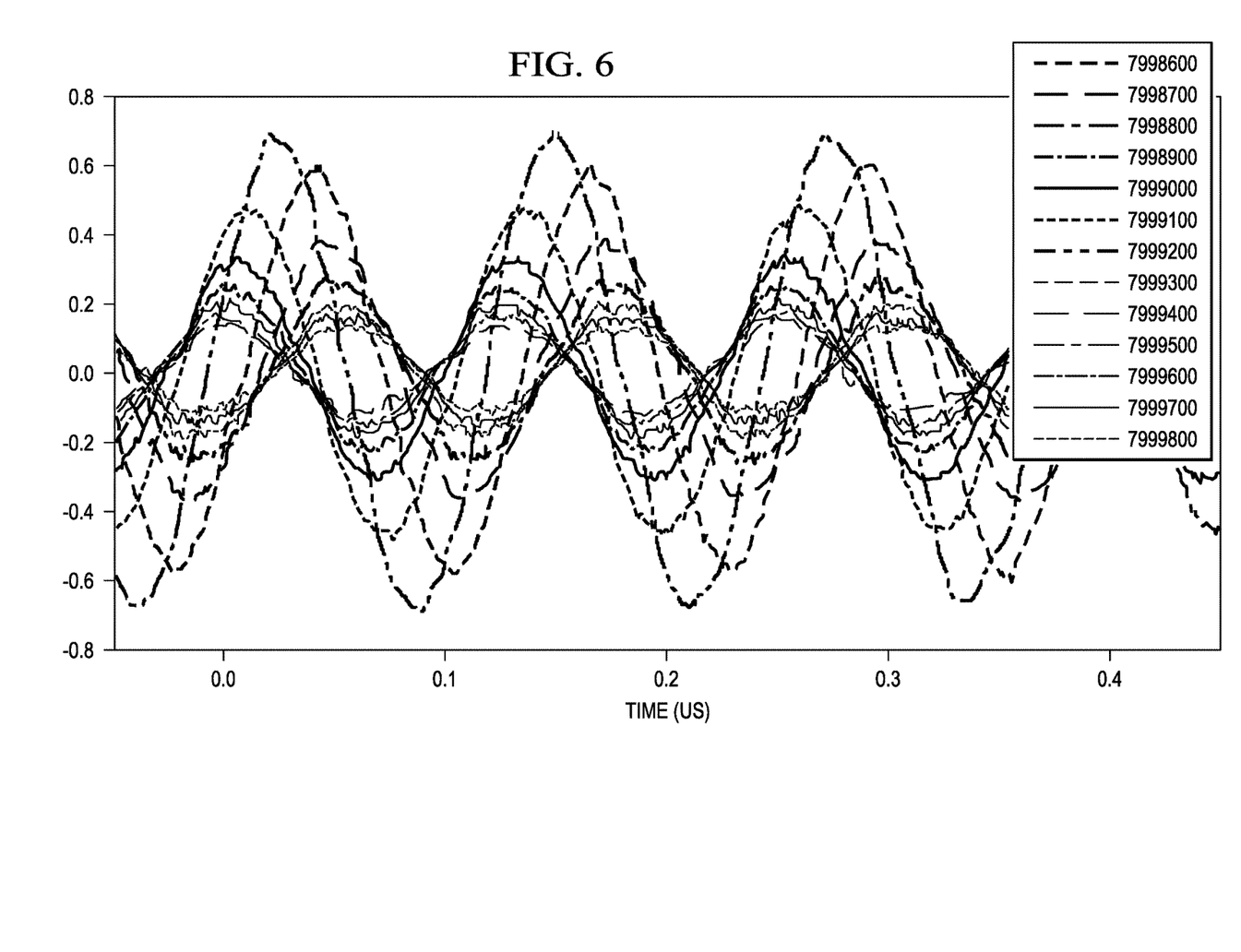
FIGS. 6 and 7 illustrate driving a physical crystal at various frequencies close to resonance, according to embodiments of the present disclosure.
Figure 7:
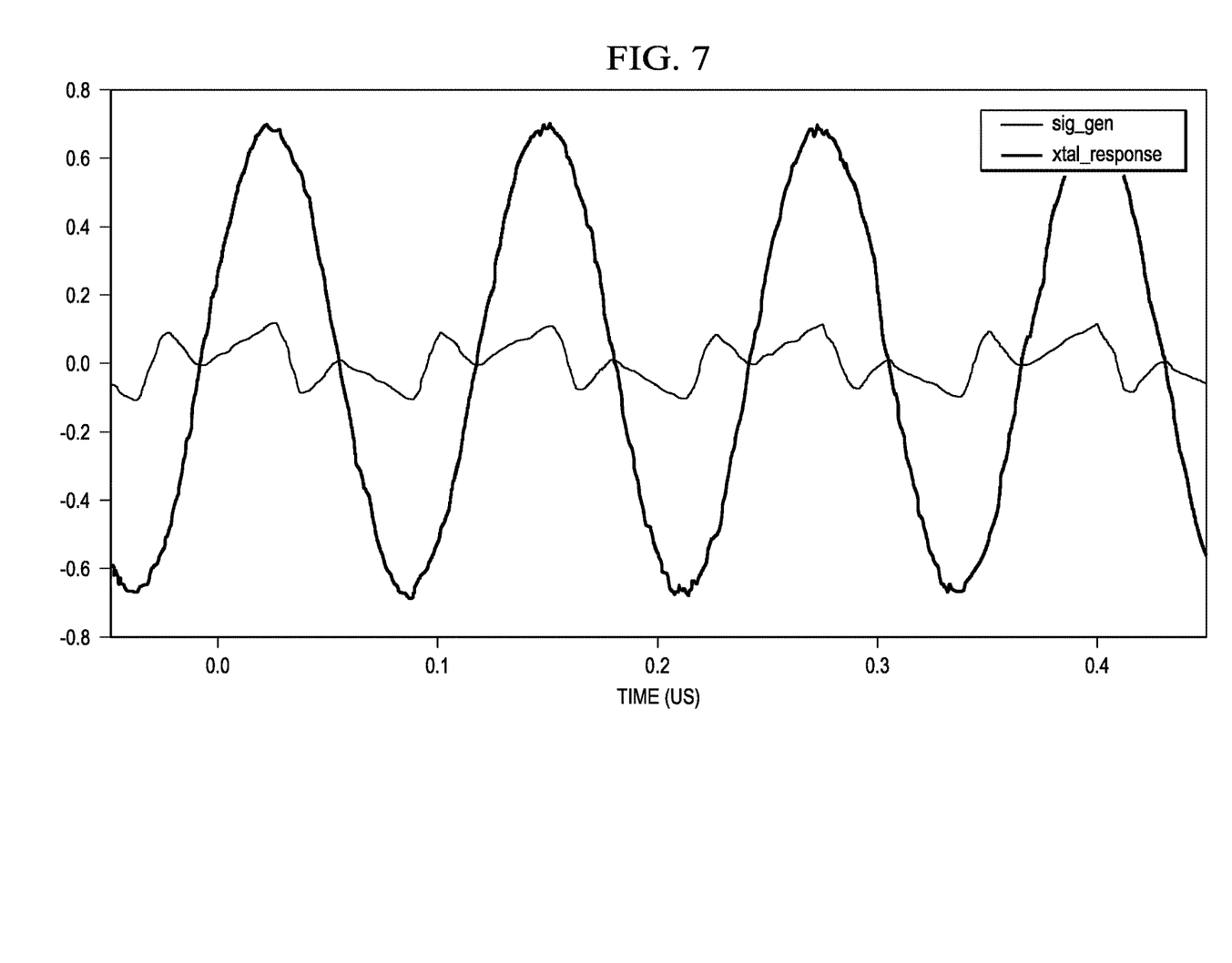

FIGS. 6 and 7 illustrate driving an actual crystal at various frequencies close to resonance, according to embodiments of the present disclosure. These figures can be used for determining sensitivity of phase and amplitude response to changes in frequency. A signal generator was used to apply a square wave of known frequency.

FIG. 6 shows the voltage response at various drive frequencies. The oscilloscope used to generate FIG. 6 was triggered by frequency generator's SYNC signal, at time t=0. The zero-crossing time changes as a function of frequency, indicating a phase shift that is sensitive to small changes in frequency. At maximum resonance, the phase shift is about 90°, as can be seen in FIG. 7. The square wave signal degrades to a waveform with sags near the zero crossings of the voltage response presumably at the point of highest current draw. Because the crystal has such a narrow bandpass effect, the output may still appear sinusoidal. The gain is roughly in the 4-8 range (12-18 dB).

A hybrid approach as described in this disclosure and implemented as oscillators 100, 200 may deliver the advantages of both internal FRC oscillator and the accuracy of an external crystal. These may include fast startup times of the FRC oscillator; stability and reliability of the FRC oscillator; accuracy of the crystal oscillator; flexibility in selecting crystal oscillator frequencies, using a clock multiplier/divider; fault-tolerance; very low impact of oscillator startup failure or failure at runtime; seamless and inherent fallback to FRC oscillation; fault-detection possible (detect low signal amplitude or too much variation in phase detector output) to provide feedback to firmware; low control bandwidth requirements of the outer PLL (the FRC oscillator controls moderate-to-high-frequency jitter performance, and the outer PLL is used only for low-frequency correction of the oscillator frequency to meet accuracy requirements); sensitivity to external circuit response phase, rather than loop gain (this may make the oscillation frequency more stable over temperature, since changes in output driver gain would not affect the output of the phase detector); additional flexibility for driver output amplitude, to decrease power dissipation; possible use of energy recovery (90° phase shift represents pure reactive power) to decrease power dissipation; and possible use of only one pin for output and input, wherein current is applied and voltage is sensed.

Although example embodiments have been described above, other variations and embodiments may be made from this disclosure without departing from the spirit and scope of these embodiments.

The invention claimed is:

1. An oscillator, comprising:
a tunable oscillator communicatively coupled with a first pin and configured to issue output through the first pin;
a phase detector circuit communicatively coupled with an output of the tunable oscillator and an input to the oscillator; and
an oscillator controller circuit configured to adjust frequency of the tunable oscillator based upon phase detection between output of the tunable oscillator and output of an external resonant element received at the input to the oscillator; wherein:
the phase detector circuit is further configured to receive input from the external resonant element through the first pin for the oscillator.

2. The oscillator of claim 1, further comprising a second pin communicatively coupled to input to the oscillator, wherein:
the tunable oscillator is configured to issue output through the first pin; and
the phase detector circuit is configured to receive input to the oscillator through the second pin.

3. The oscillator of claim 1, wherein:
the tunable oscillator is configured to issue output through a driver circuit at the first pin; and
the phase detector circuit is configured to receive input to the oscillator through the first pin;
the driver circuit is configured to issue the output at the first pin as a current source and to detect voltage on the first pin as the input to the oscillator.

4. The oscillator of claim 1, wherein the oscillator controller circuit is further configured to output a crystal oscillator status based upon input to the oscillator.

5. The oscillator of claim 1, wherein the oscillator controller circuit is further configured to maintain output of the tunable oscillator based upon a determination that an external resonant element has failed to generate a usable input to the oscillator.

6. The oscillator of claim 1, wherein the oscillator controller circuit is further configured to adjust output of the tunable oscillator based upon a determination that a phase lock has been achieved between output of the tunable oscillator and the input to the oscillator.

7. The oscillator of claim 1, wherein the oscillator controller circuit is further configured to maintain output of the tunable oscillator based upon a determination that a phase lock between output of the tunable oscillator and the input to the oscillator has been lost.

8. The oscillator of claim 1, further comprising a frequency multiplier circuit coupled between the tunable oscillator and the first pin, wherein an output of the frequency multiplier is coupled with the phase detector circuit to provide the output of the tunable oscillator.

9. A microcontroller, comprising:
a processor;
one or more peripheral circuits; and
an oscillator, comprising:
a tunable oscillator communicatively coupled with a first pin and configured to provide an oscillation signal to one or more of the peripheral circuits through the first pin;
a phase detector circuit communicatively coupled with an output of the tunable oscillator and an input to the oscillator; and
an oscillator controller circuit configured to adjust frequency of the tunable oscillator based upon phase detection between output of the tunable oscillator and output of an external resonant element received at the input to the oscillator;
wherein the phase detector circuit is further configured to receive input from the external resonant element through the first pin for the oscillator.

10. The microcontroller of claim 9, further comprising a second pin communicatively coupled to input to the oscillator, wherein:
the tunable oscillator is configured to issue output through the first pin; and
the phase detector circuit is configured to receive input to the oscillator through the second pin.

11. The microcontroller of claim 9, wherein:
the tunable oscillator is configured to issue output through a driver circuit at the first pin; and the phase detector circuit is configured to receive input to the oscillator through the first pin;

the driver circuit is configured to issue the output at the first pin as a current source and to detect voltage on the first pin as the input to the oscillator.

12. The microcontroller of claim 9, wherein the oscillator controller circuit is further configured to output a crystal oscillator status based upon input to the oscillator.

13. The microcontroller of claim 9, wherein the oscillator controller circuit is further configured to maintain output of the tunable oscillator based upon a determination that an external resonant element has failed to generate a usable input to the oscillator.

14. The microcontroller of claim 9, wherein the oscillator controller circuit is further configured to adjust output of the tunable oscillator based upon a determination that a phase lock has been achieved between output of the tunable oscillator and the input to the oscillator.

15. The microcontroller of claim 9, wherein the oscillator controller circuit is further configured to maintain output of the tunable oscillator based upon a determination that a phase lock between output of the tunable oscillator and the input to the oscillator has been lost.

16. The microcontroller of claim 9, further comprising a frequency multiplier circuit coupled between the tunable oscillator and the first pin, wherein an output of the frequency multiplier is coupled with the phase detector circuit to provide the output of the tunable oscillator.

17. A system, comprising:
 a semiconductor device, comprising a first external pin and an internal oscillator; and
 an external resonant element coupled to the semiconductor device at least through the first external pin;
 wherein the internal oscillator comprises:
  a tunable oscillator communicatively coupled with the first pin and configured to provide an oscillation signal to a portion of the semiconductor device through the first pin;
  a phase detector circuit communicatively coupled with an output of the tunable oscillator and an input to the internal oscillator; and
  an oscillator controller circuit configured to adjust frequency of the tunable oscillator based upon phase detection between output of the tunable oscillator and output of the external resonant element received at the input to the internal oscillator;
 wherein the phase detector circuit is further configured to receive input from the external resonant element through the first pin for the oscillator.

* * * * *